United States Patent
Tang et al.

(10) Patent No.: US 9,716,032 B2
(45) Date of Patent: Jul. 25, 2017

(54) VIA-FREE INTERCONNECT STRUCTURE WITH SELF-ALIGNED METAL LINE INTERCONNECTIONS

(71) Applicant: Taiwan Semiconductor Manufacturing Company, Ltd., Hsin-Chu (TW)

(72) Inventors: Yu-Po Tang, Taipei (TW); Shih-Ming Chang, Zhubei (TW); Ken-Hsien Hsieh, Taipei (TW); Ru-Gun Liu, Zhubei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/331,272

(22) Filed: Jul. 15, 2014

(65) Prior Publication Data
US 2014/0322910 A1    Oct. 30, 2014

Related U.S. Application Data

(62) Division of application No. 13/461,224, filed on May 1, 2012, now Pat. No. 8,779,592.

(51) Int. Cl.
*H01L 21/768* (2006.01)
*H01L 23/522* (2006.01)

(52) U.S. Cl.
CPC .. *H01L 21/76838* (2013.01); *H01L 21/76897* (2013.01); *H01L 23/522* (2013.01); *H01L 23/5221* (2013.01); *H01L 2924/0002* (2013.01)

(58) Field of Classification Search
CPC .......... H01L 2924/002; H01L 2924/00; H01L 21/76897; H01L 23/522; H01L 23/5221; H01L 2924/0002; H01L 21/76838
See application file for complete search history.

(56) References Cited

U.S. PATENT DOCUMENTS 4,677,742 A * 7/1987 Johnson .................. 438/131
4,776,087 A * 10/1988 Cronin ............... H01L 23/5384
                                                257/E23.174

(Continued)

FOREIGN PATENT DOCUMENTS

KR    20110075354 A    7/2011

*Primary Examiner* — Brett Feeney
*Assistant Examiner* — Sophia Nguyen
(74) *Attorney, Agent, or Firm* — Haynes and Boone, LLP

(57) ABSTRACT

The present disclosure provides a method for forming a semiconductor device. The semiconductor device includes a first conductive line disposed over a substrate. The first conductive line is located in a first interconnect layer and extends along a first direction. The semiconductor device includes a second conductive line and a third conductive line each extending along a second direction different from the first direction. The second and third conductive lines are located in a second interconnect layer that is different from the first interconnect layer. The second and third conductive lines are separated by a gap that is located over or below the first conductive line. The semiconductor device includes a fourth conductive line electrically coupling the second and third conductive lines together. The fourth conductive line is located in a third interconnect layer that is different from the first interconnect layer and the second interconnect layer.

15 Claims, 11 Drawing Sheets

(56) References Cited

U.S. PATENT DOCUMENTS

| | | | |
|---|---|---|---|
| 4,840,923 A * | 6/1989 | Flagello | H01L 21/4846 148/DIG. 164 |
| 4,857,987 A * | 8/1989 | Ogura | H01L 27/0233 257/576 |
| 4,962,058 A * | 10/1990 | Cronin et al. | 438/622 |
| 4,987,101 A * | 1/1991 | Kaanta et al. | 438/619 |
| 5,169,802 A * | 12/1992 | Yeh | H01L 21/76895 257/E21.59 |
| 5,191,405 A * | 3/1993 | Tomita et al. | 257/777 |
| 5,471,094 A * | 11/1995 | Lien | H01L 23/5226 257/412 |
| 5,616,961 A * | 4/1997 | Kohyama | H01L 21/76838 257/758 |
| 5,818,110 A * | 10/1998 | Cronin | H01L 21/76877 257/775 |
| 5,949,098 A | 9/1999 | Mori | |
| 6,048,797 A * | 4/2000 | Hsu | H01L 21/76802 257/E21.577 |
| 6,103,617 A * | 8/2000 | Yoon | H01L 21/76807 257/E21.579 |
| 6,211,073 B1 * | 4/2001 | Ahn et al. | 438/653 |
| 6,399,471 B1 * | 6/2002 | Lim | H01L 21/76838 257/E21.582 |
| 6,445,071 B1 | 9/2002 | Haruhana | |
| 6,483,736 B2 * | 11/2002 | Johnson et al. | 365/130 |
| 6,486,558 B2 | 11/2002 | Sugiyama | |
| 6,541,862 B2 | 4/2003 | Amishiro | |
| 6,576,848 B1 * | 6/2003 | Cronin et al. | 174/261 |
| 6,627,530 B2 * | 9/2003 | Li et al. | 438/622 |
| 6,657,302 B1 | 12/2003 | Shao | |
| 6,710,425 B2 * | 3/2004 | Bothra | 257/532 |
| 6,717,267 B1 | 4/2004 | Kunikiyo | |
| 6,727,590 B2 | 4/2004 | Izumitani | |
| 6,779,167 B2 * | 8/2004 | Igarashi | G06F 17/5077 257/774 |
| 6,838,764 B2 * | 1/2005 | Farrar | 257/700 |
| 6,911,389 B2 * | 6/2005 | Brennan | H01L 21/7681 257/E21.579 |
| 6,952,043 B2 * | 10/2005 | Vyvoda et al. | 257/530 |
| 7,042,099 B2 * | 5/2006 | Kurashima | H01L 21/76832 257/295 |
| 7,087,516 B2 * | 8/2006 | Hau-Riege | H01L 23/522 257/E23.142 |
| 7,134,111 B2 * | 11/2006 | Nakamoto | G06F 17/5068 257/774 |
| 7,186,593 B2 * | 3/2007 | Kim | H01L 23/5258 257/E21.657 |
| 7,208,831 B2 * | 4/2007 | Fukazawa | H01L 21/76807 257/254 |
| 7,247,552 B2 | 7/2007 | Pozder | |
| 7,256,474 B2 | 8/2007 | Wakayama | |
| 7,282,803 B2 | 10/2007 | Cathelin | |
| 7,288,786 B2 | 10/2007 | Janke | |
| 7,301,218 B2 | 11/2007 | Lee | |
| 7,474,003 B2 | 1/2009 | Koubuchi | |
| 7,482,675 B2 | 1/2009 | Adkisson | |
| 7,483,292 B2 * | 1/2009 | Lung | 365/158 |
| 7,504,724 B2 | 3/2009 | Futatsuyama | |
| 7,511,376 B2 * | 3/2009 | Lin et al. | 257/734 |
| 7,534,647 B2 * | 5/2009 | Lung | 438/95 |
| 7,547,973 B2 | 6/2009 | Matsuno | |
| 7,586,175 B2 | 9/2009 | Lee | |
| 7,608,503 B2 * | 10/2009 | Lung et al. | 438/253 |
| 7,863,654 B2 * | 1/2011 | Lin | 257/211 |
| 7,911,063 B2 | 3/2011 | Terazono | |
| 7,960,269 B2 | 6/2011 | Lo | |
| 8,021,918 B2 | 9/2011 | Lin | |
| 8,065,649 B2 * | 11/2011 | Hetzel | G06F 17/5077 716/100 |
| 8,102,056 B2 | 1/2012 | Takemura | |
| 8,178,905 B2 * | 5/2012 | Toubou | H01L 27/0207 257/207 |
| 8,198,188 B1 * | 6/2012 | Pierrat | H01L 21/76807 257/758 |
| 8,232,650 B2 | 7/2012 | Chibahara | |
| 8,274,080 B2 | 9/2012 | Han | |
| 8,283,713 B2 | 10/2012 | Jansen | |
| 8,324,681 B2 * | 12/2012 | Lai et al. | 257/324 |
| RE43,912 E | 1/2013 | Ogata | |
| 8,373,202 B2 | 2/2013 | Lin | |
| 8,431,474 B2 | 4/2013 | Xia | |
| 8,455,925 B2 | 6/2013 | Moritoki | |
| 8,502,383 B2 | 8/2013 | Fornara | |
| 8,679,914 B2 * | 3/2014 | Quick | 438/257 |
| 8,729,521 B2 * | 5/2014 | Lung et al. | 257/3 |
| 8,779,592 B2 * | 7/2014 | Tang | H01L 23/5221 257/211 |
| 8,932,474 B1 * | 1/2015 | Cok | H05K 3/4685 216/13 |
| 2002/0111012 A1 | 8/2002 | Colgan et al. | |
| 2003/0001270 A1 | 1/2003 | Haruhana et al. | |
| 2003/0014726 A1 * | 1/2003 | Hasegawa | G06F 17/5077 716/129 |
| 2004/0005729 A1 * | 1/2004 | Abe | H01L 23/544 438/48 |
| 2004/0021196 A1 * | 2/2004 | Brennan et al. | 257/508 |
| 2004/0164419 A1 | 8/2004 | Ahn et al. | |
| 2005/0045919 A1 * | 3/2005 | Kaeriyama et al. | 257/211 |
| 2005/0161820 A1 | 7/2005 | Ramaraju | |
| 2006/0056218 A1 * | 3/2006 | Park et al. | 365/63 |
| 2006/0118958 A1 * | 6/2006 | Yang et al. | 257/758 |
| 2008/0197494 A1 * | 8/2008 | Matsubara | H01L 21/76808 257/741 |
| 2009/0002012 A1 * | 1/2009 | Doong | G01R 31/2853 324/762.03 |
| 2009/0045039 A1 * | 2/2009 | Hayashi | B81B 3/0054 200/238 |
| 2009/0050886 A1 * | 2/2009 | Lee | G11C 29/24 257/48 |
| 2009/0166868 A1 | 7/2009 | Lee et al. | |
| 2009/0207291 A1 * | 8/2009 | Abe | H01L 27/14603 348/308 |
| 2009/0267198 A1 | 10/2009 | Tada | |
| 2010/0039016 A1 * | 2/2010 | Lhee | H01L 51/0021 313/307 |
| 2010/0090308 A1 * | 4/2010 | Sardana | H01L 23/5223 257/532 |
| 2010/0159690 A1 | 6/2010 | Kasaoka | |
| 2010/0187623 A1 * | 7/2010 | Becker | H01L 27/0207 257/369 |
| 2010/0187624 A1 * | 7/2010 | Becker | H01L 27/0207 257/369 |
| 2010/0187698 A1 * | 7/2010 | Uchiyama | H01L 23/5226 257/774 |
| 2011/0084265 A1 * | 4/2011 | Arasawa | H01L 33/16 257/43 |
| 2011/0085104 A1 * | 4/2011 | Arasawa | H01L 27/1225 349/43 |
| 2011/0101534 A1 * | 5/2011 | Stamper | H01L 21/76838 257/773 |
| 2011/0215469 A1 | 9/2011 | Lo et al. | |
| 2012/0032336 A1 * | 2/2012 | Lin | 257/773 |
| 2012/0057270 A1 | 3/2012 | Foerster | |
| 2012/0068294 A1 | 3/2012 | Lee | |
| 2012/0112364 A1 * | 5/2012 | Chang | H01L 23/528 257/775 |
| 2012/0126422 A1 * | 5/2012 | Endo | H01L 23/5286 257/774 |
| 2012/0280360 A1 * | 11/2012 | Dirnecker | H01L 23/5228 257/536 |
| 2012/0312072 A1 * | 12/2012 | Stringham et al. | 73/19.03 |
| 2013/0087881 A1 * | 4/2013 | Ikegami | H01L 27/0207 257/499 |
| 2013/0141963 A1 * | 6/2013 | Liaw | G11C 11/412 365/156 |
| 2013/0176073 A1 * | 7/2013 | Bao et al. | 327/525 |
| 2013/0228929 A1 | 9/2013 | Meinhold | |
| 2013/0270704 A1 * | 10/2013 | Chang et al. | 257/758 |
| 2013/0270710 A1 | 10/2013 | Chen | |

(56) References Cited

U.S. PATENT DOCUMENTS

| | | | |
|---|---|---|---|
| 2013/0292836 A1 | 11/2013 | Tang | |
| 2013/0307115 A1* | 11/2013 | Filippi et al. | 257/530 |
| 2015/0054568 A1* | 2/2015 | Rasouli | H01L 21/823871 |
| | | | 327/382 |
| 2015/0085456 A1* | 3/2015 | Cok | H05K 1/0274 |
| | | | 361/767 |
| 2015/0102504 A1* | 4/2015 | Park | H01L 23/5221 |
| | | | 257/776 |
| 2015/0155853 A1* | 6/2015 | Toyota | H03H 9/02897 |
| | | | 333/193 |
| 2015/0173175 A1* | 6/2015 | Kawakami | H01L 23/49822 |
| | | | 361/760 |
| 2015/0179691 A1* | 6/2015 | Yanagita | H01L 27/14634 |
| | | | 257/292 |
| 2015/0270176 A1* | 9/2015 | Xie | H01L 21/823475 |
| | | | 257/384 |
| 2015/0357282 A1* | 12/2015 | Lau | H01L 23/5226 |
| | | | 257/401 |

* cited by examiner

VIA-FREE INTERCONNECT STRUCTURE WITH SELF-ALIGNED METAL LINE INTERCONNECTIONS

RELATED APPLICATION

This is a divisional of U.S. application Ser. No. 13/461,224, which was filed on May 1, 2012, the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

As the semiconductor industry has progressed into nanometer technology process nodes in pursuit of higher device density, higher performance, and lower costs, challenges from both fabrication and design have resulted in the development of multilayer (or three dimensional) integrated devices. The multilayer devices may include a plurality of interconnect layers each including one or more conductive lines which are interconnected with conductive lines from other interconnect layers. However, as the scaling down continues, forming and aligning these conductive lines has proven to be difficult.

Accordingly, although existing multilayer devices and methods of fabricating multilayer devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
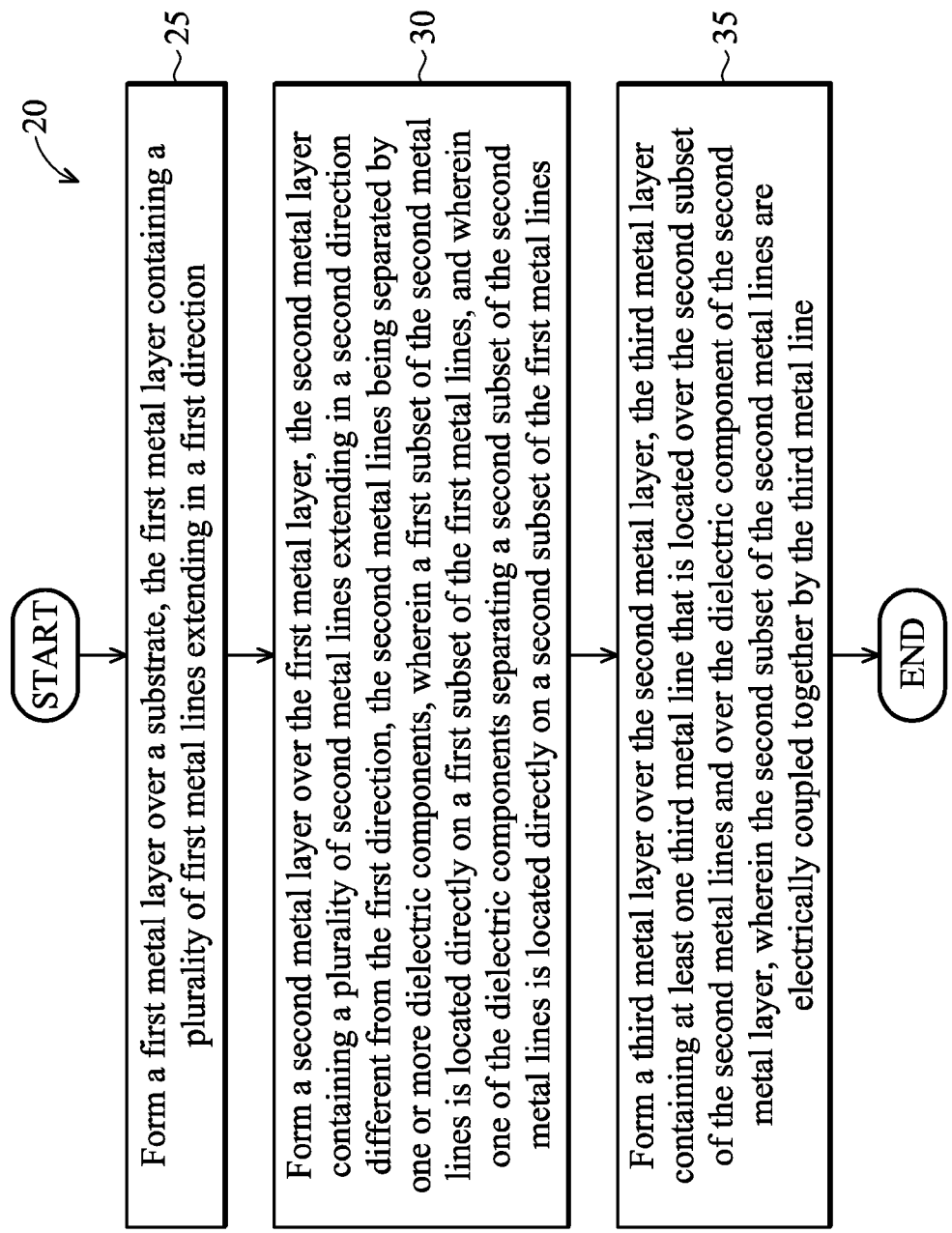
FIG. 1 is a flowchart illustrating a method of fabricating a semiconductor device according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Modern semiconductor devices may utilize an interconnect structure to perform electrical routing between the various components and features on a semiconductor wafer and to establish electrical connections with external devices. For example, an interconnect structure may include a plurality of patterned dielectric layers and interconnected conductive layers. These interconnected conductive layers provide interconnections (e.g., wiring) between circuitries, inputs/outputs, and various doped features formed in a semiconductor substrate. In more detail, the interconnect structure may include a plurality of interconnect layers, also referred to as metal layers (e.g., M1, M2, M3, etc). Each of the interconnect layers includes a plurality of interconnect features, also referred to as metal lines. An interlayer dielectric (ILD) of the interconnect structure provides isolation between the metal lines.

An interconnect structure may also includes a plurality of vias/contacts that provide electrical connections between the metal lines from different interconnect layers. For example, a via may extend vertically and therefore allows a metal line from the M1 layer to be electrically connected to another metal line from the M2 layer. As semiconductor device fabrication technologies continue to evolve, the sizes of the various features on a semiconductor device become smaller and smaller, including the sizes of the vias and metal lines. This leads to fabrication challenges. For example, the formation of the vias may involve one or more lithography and etching processes. Variations associated with these processes (e.g., critical dimension uniformity variations or lithography overlay errors) exacerbate via alignment problems. Alternatively stated, the device scaling down process may place a more stringent requirement on the precise alignment between the via and the interconnected metal lines above and/or below, since a small shift can cause the via to be misaligned with the metal lines. Therefore, an improved interconnect structure that does not suffer from these via alignment problems is desired.

According to the various aspects of the present disclosure, a via-free interconnect structure is disclosed. The via-free interconnect structure contains metal layers where the metal lines are directly coupled to other metal lines from different metal layers, thereby obviating the need for vias to perform the interconnections. In other words, the metal lines are self-aligned. The various aspects of such interconnect structure is described in more detail below.

FIG. 1 is a flowchart of a method 20 for fabricating an interconnect structure of the present disclosure. The method 20 includes a block 25 in which a first metal layer is formed over a substrate. The first metal layer contains a plurality of first metal lines extending in a first direction. The method 20 includes a block 30 in which a second metal layer is formed over the first metal layer. The second metal layer contains a plurality of second metal lines extending in a second direction different from the first direction. The second metal lines are separated by one or more dielectric components. A first subset of the second metal lines is located directly on a first subset of the first metal lines. One of the dielectric components separating a second subset of the second metal lines is located directly on a second subset of the first metal lines. The method 20 includes a block 35 in which a third metal layer is formed over the second metal layer. The third metal layer contains at least one third metal line that is located over the second subset of the second metal lines and over the dielectric component of the second metal layer. The second subset of the second metal lines are electrically coupled together by the third metal line. In some embodiments, the first metal layer, the second metal layer, and the third metal layer are formed to be free of electrical vias.

FIGS. 2-5 are diagrammatic fragmentary cross-sectional side views of a semiconductor device 40 (that includes an interconnect structure) at various stages of fabrication in accordance with various aspects of the present disclosure. It is understood that FIGS. 2-5 have been simplified for a better understanding of the inventive concepts of the present disclosure. Accordingly, it should be noted that additional processes may be provided before, during, and after the processes shown in FIGS. 2-5, and that some other processes may only be briefly described herein.

Figure 2:
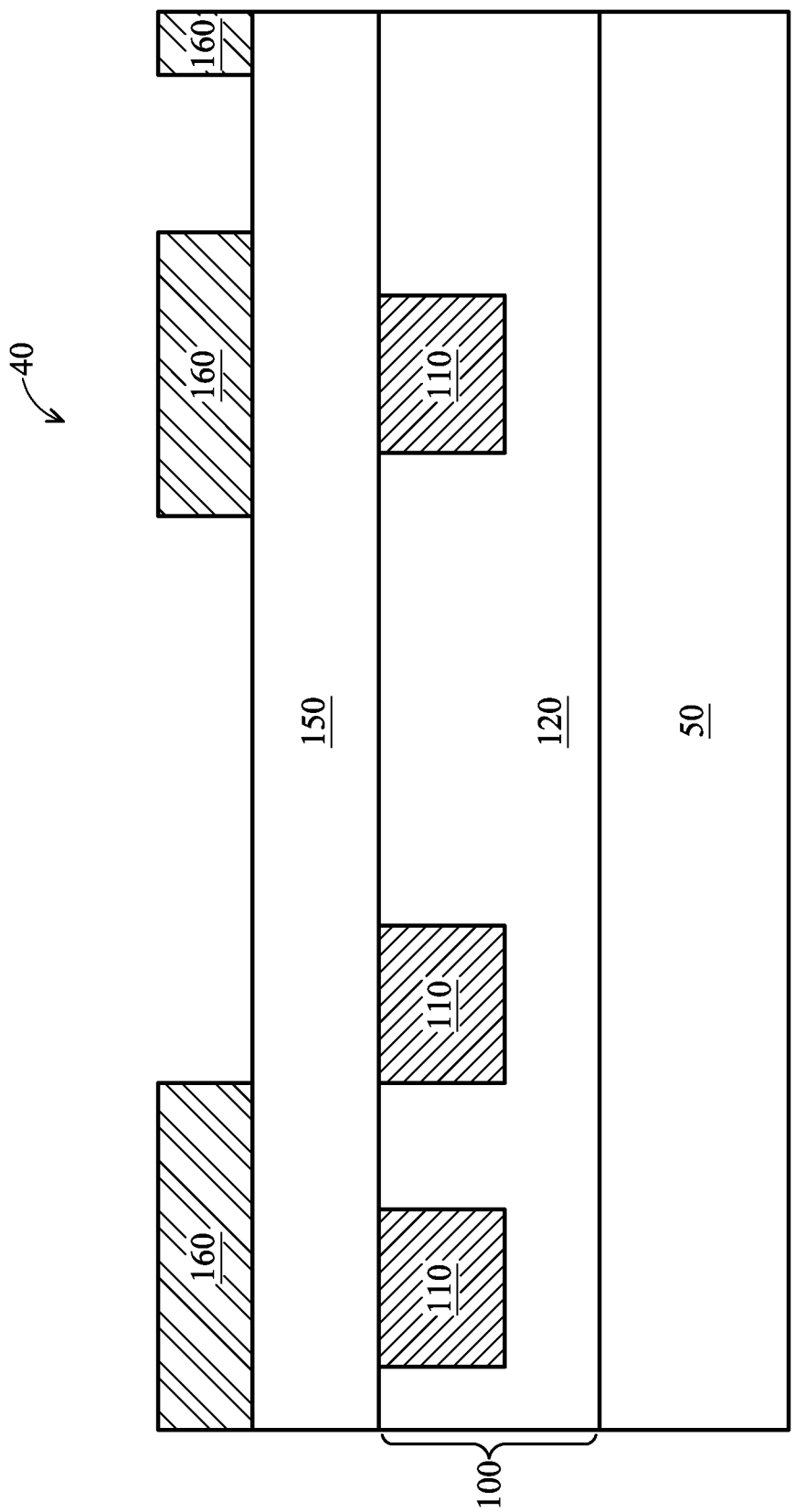
FIGS. 2-5 and 8-10 are diagrammatic fragmentary cross-sectional side views of a semiconductor device at various stages of fabrication in accordance with various aspects of the present disclosure.

Referring to FIG. 2, the semiconductor device 40 may be a semiconductor Integrated Circuit (IC) chip, system on chip (SoC), or portion thereof, that may include memory circuits, logic circuits, high frequency circuits, image sensors, and various passive and active components such as resistors, capacitors, and inductors, P-channel field effect transistors (pFET), N-channel FET (nFET), metal-oxide semiconductor field effect transistors (MOSFET), or complementary metal-oxide semiconductor (CMOS) transistors, bipolar junction transistors (BJT), laterally diffused MOS (LDMOS) transistors, high power MOS transistors, or other types of transistors. It should be noted that some features of the semiconductor device 40 may be fabricated with a CMOS process flow.

The semiconductor device 40 includes a substrate 50. In the embodiment shown, the substrate 50 is a silicon substrate that is doped with a P-type dopant such as boron. In another embodiment, the substrate 50 is a silicon substrate that is doped with an N-type dopant such as arsenic or phosphorous. The substrate may alternatively be made of some other suitable elementary semiconductor material, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, in some embodiments, the substrate 50 could include an epitaxial layer (epi layer), may be strained for performance enhancement, and may include a silicon-on-insulator (SOI) structure.

Isolation structures are formed in the substrate 50. In some embodiments, the isolation structures include shallow trench isolation (STI) devices. The STI devices contain a dielectric material, which may be silicon oxide, silicon nitride, silicon oxy-nitride, fluoride-doped silicate (FSG), and/or a low-k dielectric material known in the art. The STI devices are formed by etching trenches in the substrate 50 and thereafter filling the trenches with the dielectric material. In other embodiments, deep trench isolation (DTI) devices may also be formed in place of (or in combination with) the STI devices as the isolation structures. For reasons of simplicity, the isolation structures are not specifically herein.

A plurality of microelectronic components is also formed in the substrate. For example, source and drain regions of FET transistor devices may be formed in the substrate 50 by one or more ion implantation and/or diffusion processes. As another example, radiation-sensitive image pixels may be formed in the substrate 50. For reasons of simplicity, these microelectronic components are not specifically illustrated herein either.

An interconnect layer 100 is formed over the substrate 50. The interconnect layer 100 may also be referred to as a conductive layer or a metal layer, since it contains a plurality of metal lines 110. The metal lines 110 may be aluminum interconnect lines or copper interconnect lines, and may include conductive materials such as aluminum, copper, aluminum alloy, copper alloy, aluminum/silicon/copper alloy, titanium, titanium nitride, tantalum, tantalum nitride, tungsten, polysilicon, metal silicide, or combinations thereof. The metal lines 110 may be formed by a plurality of processes including, but not limited to, physical vapor deposition (PVD), chemical vapor deposition (CVD), sputtering, plating, etching, polishing, etc. For example, the metal lines 110 may be formed by a damascene process.

The interconnect layer 100 also contains a dielectric material 120 (also referred to as an inter-layer dielectric, or ILD) that provides isolation between the metal lines 110. The dielectric material 120 may include a dielectric material such as an oxide material. Alternatively, the dielectric material 120 may include silicon oxynitride, a low-k material such as fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The dielectric material 120 may be formed by any suitable processing including CVD, PVD, sputtering high density plasma CVD (HDP-CVD), spin-on, or other suitable methods. The CVD process, for example, may use chemicals including Hexachlorodisilane (HCD or $Si_2Cl_6$), Dichlorosilane (DCS or $SiH_2Cl_2$), Bis(TertiaryButylAmino) Silane (BTBAS or $C_8H_{22}N_2Si$) and Disilane (DS or $Si_2H_6$).

A higher level interconnect layer is then formed over the interconnect layer 100. As part of the formation of the higher level interconnect layer, a dielectric layer 150 is first formed on the interconnect layer 100. The dielectric layer 150 has substantially the same material composition as the dielectric material 120.

A patterned photoresist layer 160 is then formed on the dielectric layer 150 to define regions where the dielectric layer 150 will be subsequently etched. The patterned photoresist layer 160 may be formed by a plurality of lithography processes that may include: spin coating a layer of photoresist material on the surface of the dielectric layer 150; exposing the photoresist material to a mask pattern; performing a post-exposure bake process; developing the photoresist material, thereby forming the patterned photoresist layer 160. In other embodiments, the patterning may also be implemented or replaced by other suitable methods, such as maskless photolithography, electron-beam writing, ion-beam writing, and molecular imprint.

Figure 3:
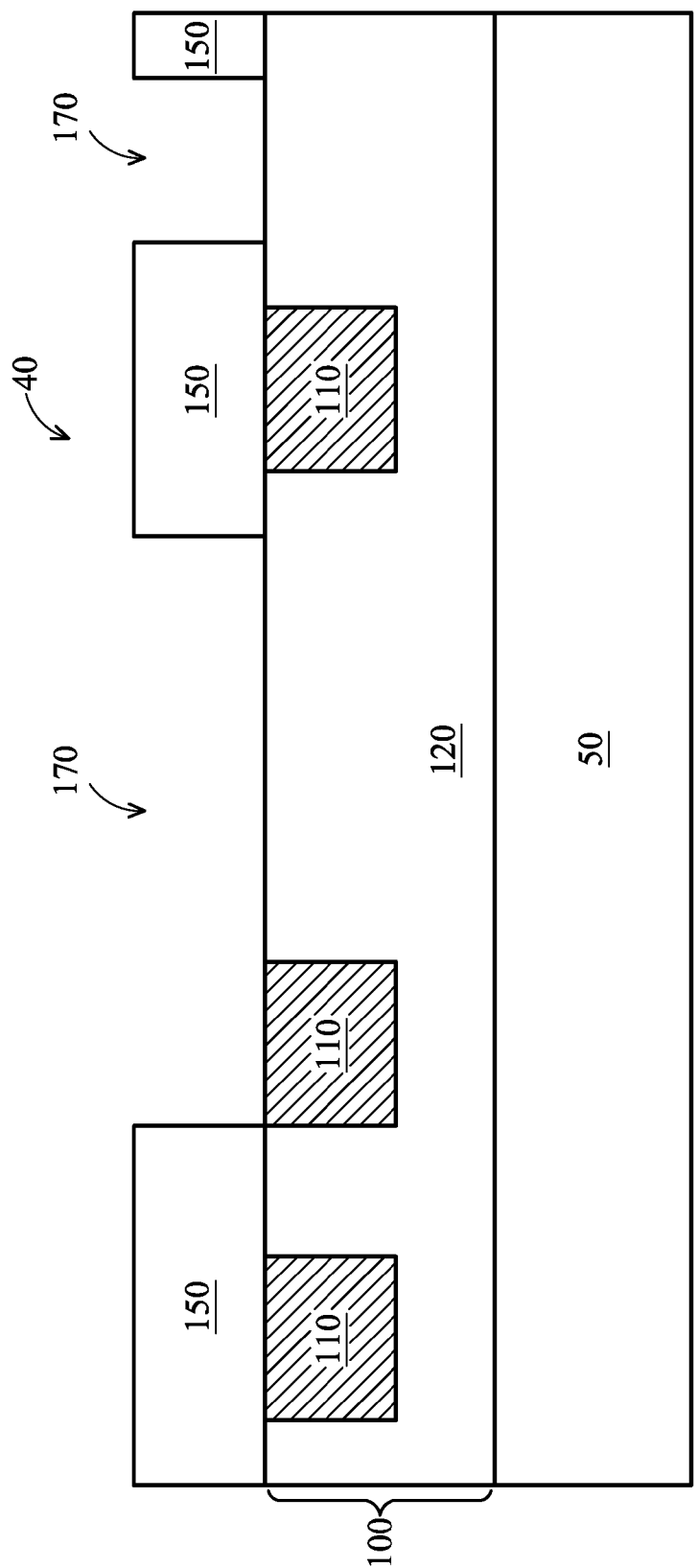

Referring now to FIG. 3, the dielectric layer 150 is patterned by the patterned photoresist layer 160, thereby forming one or more openings 170 that expose the top surface of one or more lines 110 of interconnect layer 100. The patterning of the dielectric layer 150 may include an etching process that uses the patterned photoresist layer 160 as a mask to define the area to be etched. The etching process may be a single step or a multiple step etching process.

Further, the etching process may include wet etching, dry etching, or a combination thereof. The dry etching process may be an anisotropic etching process. The etching process may use reactive ion etch (RIE) and/or other suitable process. In one example, a dry etching process is used to etch the dielectric layer 150 that includes a chemistry including fluorine-containing gas.

After the etching process is completed and the dielectric layer 150 is defined, the photoresist layer 160 may be removed by any suitable process. For example, the photoresist layer 160 may be removed by a liquid "resist stripper", which chemically alters the resist so that it no longer adheres to the underlying layer. Alternatively, the photoresist layer 160 may be removed by a plasma containing oxygen, which oxidizes it.

Figure 4:
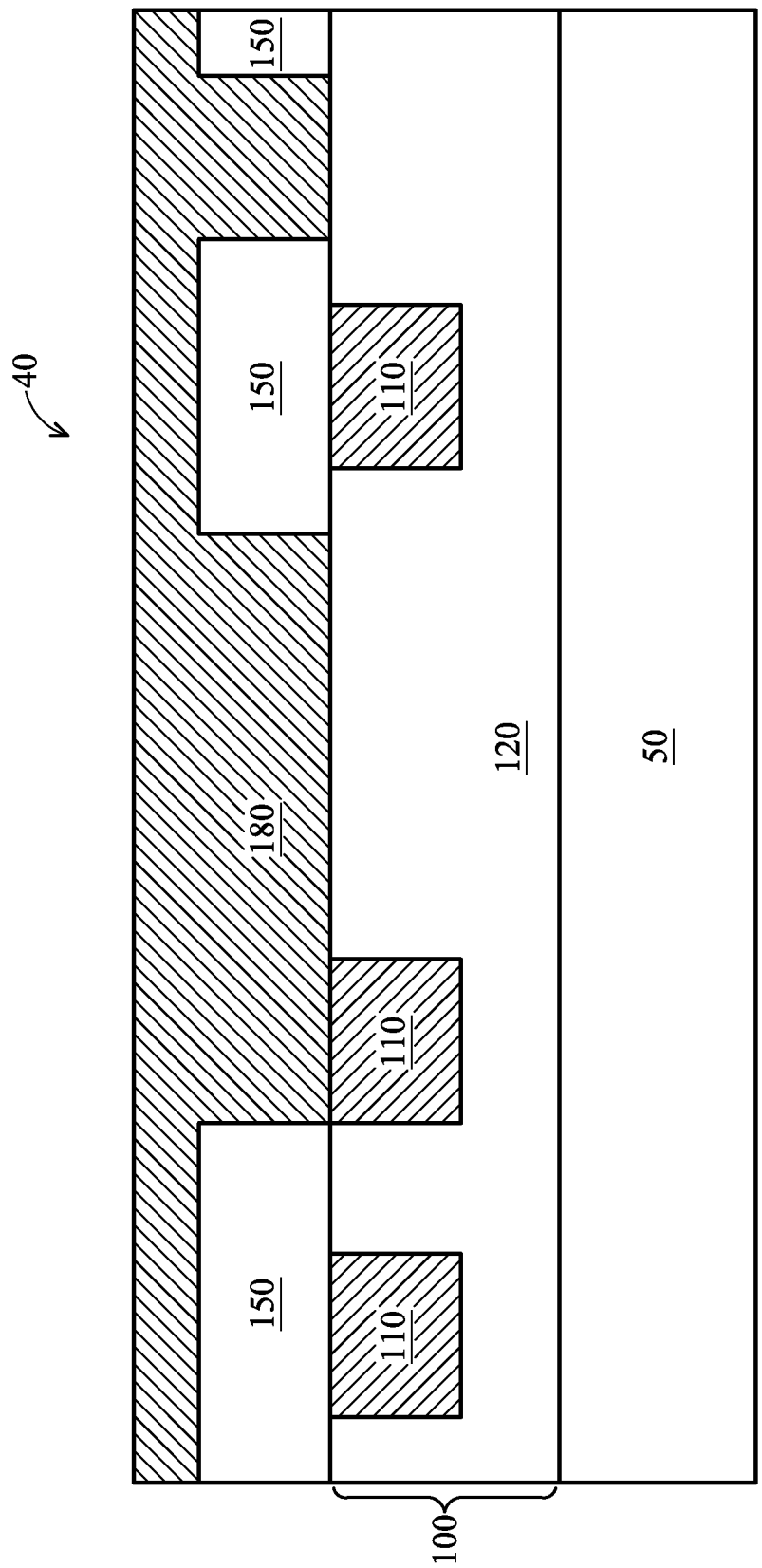

Referring now to FIG. 4, a conductive material 180 is formed to fill the openings 170 (shown in FIG. 3) by a suitable deposition process. In various embodiments, the conductive material 180 includes metal, such as copper, aluminum, tungsten, or combinations thereof. As illustrated in FIG. 4, a portion of the conductive material 180 is directly formed on a desired one of the metal lines 110. Thus, an interface between the conductive material 180 and the metal line 110 therebelow effectively constitutes a self-aligned interconnect mechanism. The reason for the self-alignment is because no via is required to be defined or formed between the metal line 110 and the conductive material 180. Instead, the metal line 110 and the conductive material 180 are in direct physical contact and are thus electrically coupled together.

Figure 5:
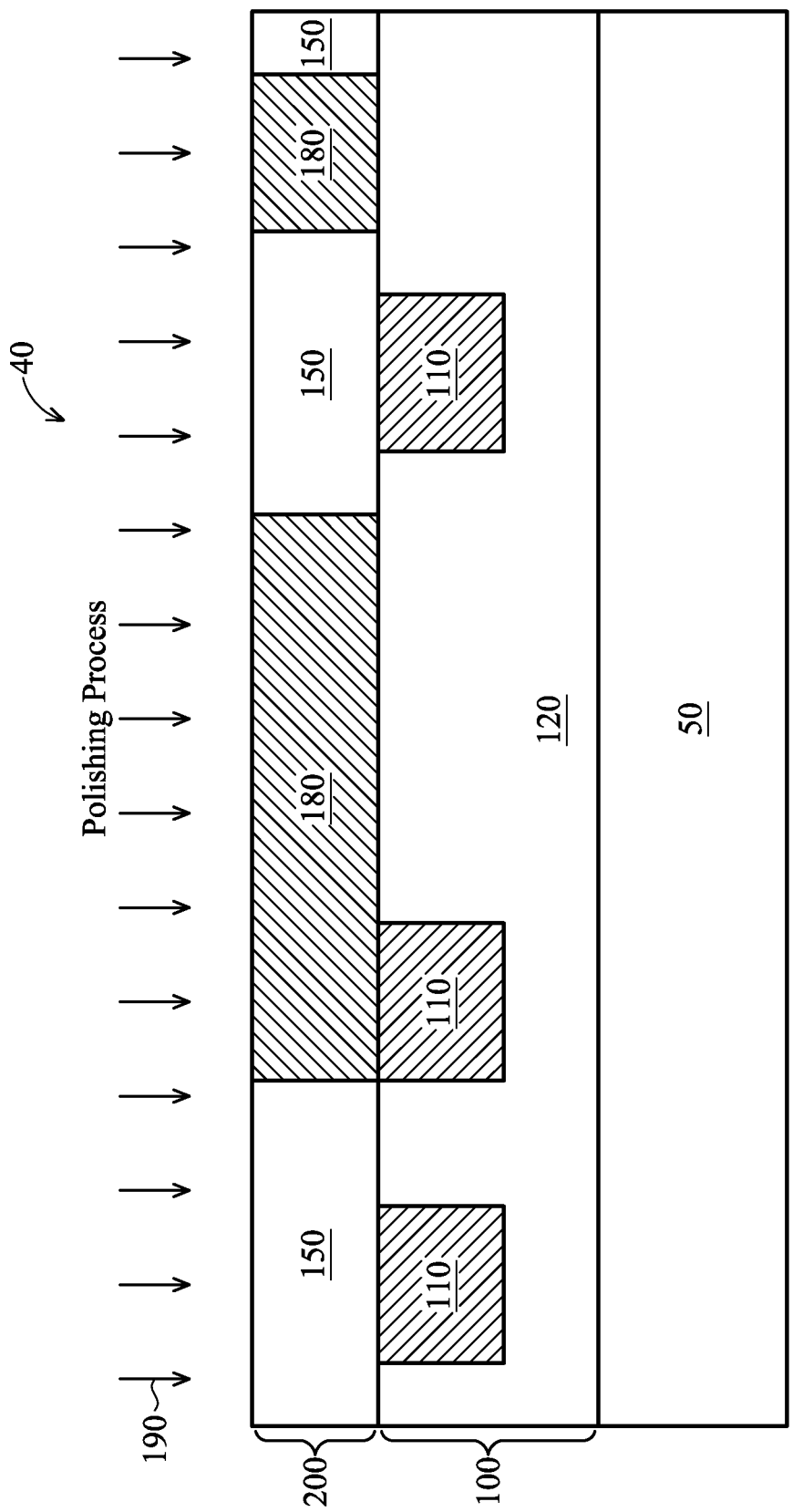

Referring now to FIG. 5, a polishing process 190 is performed to remove portions of the conductive material 180 outside the openings 170 and to planarize the surface of the dielectric layer 150 and the conductive material 180. In some embodiments, the polishing process 190 includes a chemical-mechanical-polishing (CMP) process. It is understood that in some embodiments, the photoresist material is not necessarily removed before the conductive material 180 is deposited into the openings 170, and that the photoresist material may be removed by the polishing process 190 along with the excess conductive material 180.

At this stage of fabrication, an interconnect layer 200 is formed. The interconnect layer 200 includes the conductive material 180, which are metal lines (similar to the metal lines 110) and may be referred to as such. The interconnect layer 200 also includes the dielectric layer 150 which provides physical and electrical isolation to the metal lines 180. Once again, one or more of the metal lines 110 from the interconnect layer 100 are in direct physical contact with one or more of the metal lines 180 from the interconnect layer 200. As such, these metal lines are "self-aligned" since their interconnection requires no electrical vias. To achieve the interconnection between these metal lines 110 or 180 from different interconnect layers 100 and 200, the location and size of the opening 170 (in which the metal lines 180 are formed) are configured to expose a desired metal line 110 from the lower interconnect layer 100. In this manner, the direct physical and electrical contact between the metal lines 110 and 180 can be guaranteed.

The routing approach discussed above eliminates actual vias in the interconnect structure, since the interface or interconnection between metal lines from different adjacent interconnect layers effectively constitute self-aligned vias. However, sometimes this routing approach may result in an "unwanted via." This "unwanted via" situation is illustrated more clearly in FIG. 6, which is a simplified diagrammatic fragmentary top view of an interconnect structure.

Figure 6:
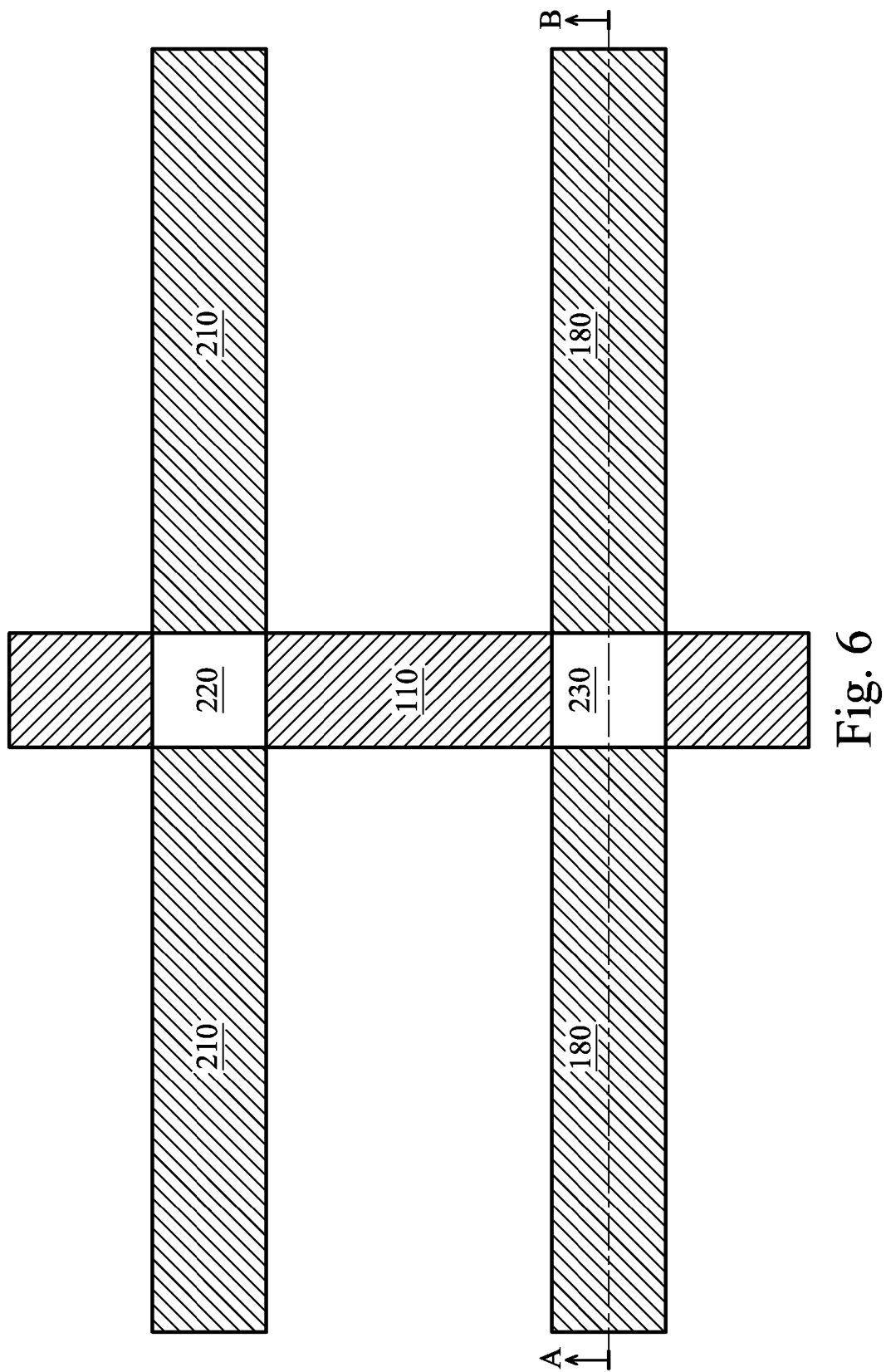
FIGS. 6-7 and 11 are diagrammatic fragmentary top views of a semiconductor device at various stages of fabrication in accordance with various aspects of the present disclosure.

As shown in FIG. 6, the metal line 110 belongs to the lower level interconnect layer 100 (FIG. 5), and the metal lines 180 and 210 belong to the upper level interconnect layer 200 (FIG. 5). From the top view of FIG. 6, the metal line 110 extends (or is oriented in) a Y-direction, and the metal lines 180 and 210 each extend in an X-direction. The X-direction and the Y-direction are perpendicular to one another. Since the metal line 110 and the metal lines 180 and 210 are in direct physical contact wherever they overlap or intersect, effective "self-aligned vias" 220 and 230 are formed by the interfaces or interconnections between the metal line 110 and the metal lines 210 and 180. Of these "vias" 220 and 230, suppose the via 220 is a desired via, but the via 230 is an unwanted or undesired via. Therefore, measures need to be taken to ensure that the unwanted via 230 is eliminated so that it does not lead to unintended electrical consequences.

Figure 7:
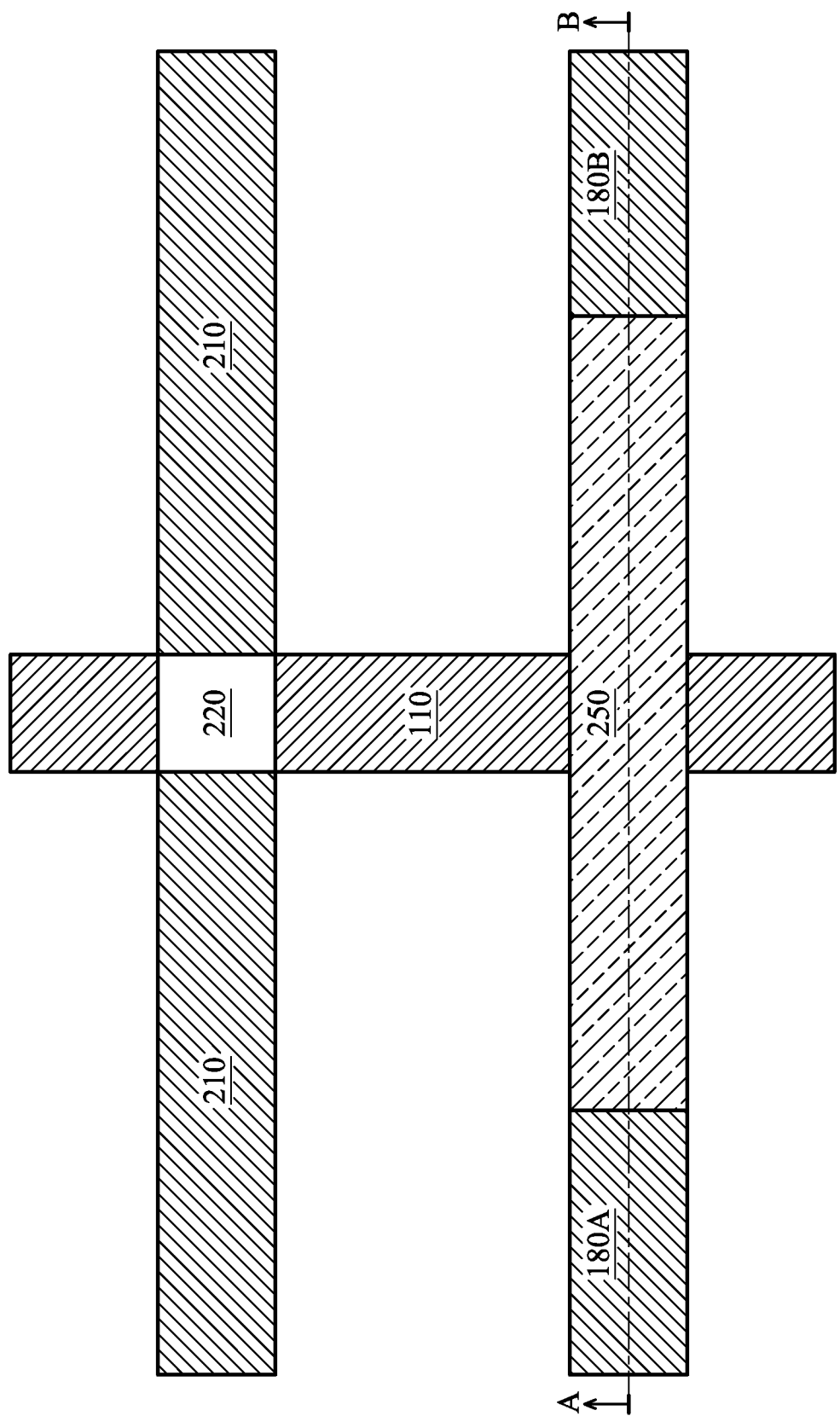

FIG. 7 illustrates a routing scheme that solves the unwanted via issue discussed above according to various aspects of the present disclosure. In more detail, FIG. 7 illustrates a simplified diagrammatic fragmentary top view of an interconnect structure that eliminates the unwanted vias. Referring to FIG. 7, the metal line 180 that would have led to the unwanted via 230 of FIG. 6 is now broken up (physically divided) into metal line segments 180A and 180B. By doing this, there is no longer any overlap or intersection between the metal line 180 and the metal line 110, thereby eliminating the unwanted via 230 of FIG. 6. Nevertheless, the original layout may call for a single metal line 180 with electrical continuity. Therefore, a metal line 250 is formed in another interconnect layer to electrically couple together the metal line segments 180A and 180B. The metal line 250 extends in the same direction as the metal line segments 180A-180B, since the metal line 250 acts as a bridge for coupling together the metal line segments 180A-180B. The interconnect layer in which the metal line 250 resides may be located one level or several levels above the interconnect layer (e.g., the interconnect layer 200 of FIG. 5) in which the metal line segments 180A-180B reside. Note that in certain embodiments, the metal line 250 may alternatively reside in an interconnect layer below the interconnect layer 100. Similarly, in some embodiments, instead of breaking up the metal line 180, the metal line 110 may be broken up as well to avoid an undesired via, and a "bridging" metal segment may be implemented in an interconnect layer above the metal line 180 (for example the interconnect layer 300) or in an interconnect layer below the metal line 110 (for example an interconnect layer below the interconnect layer 100).

Figure 8:
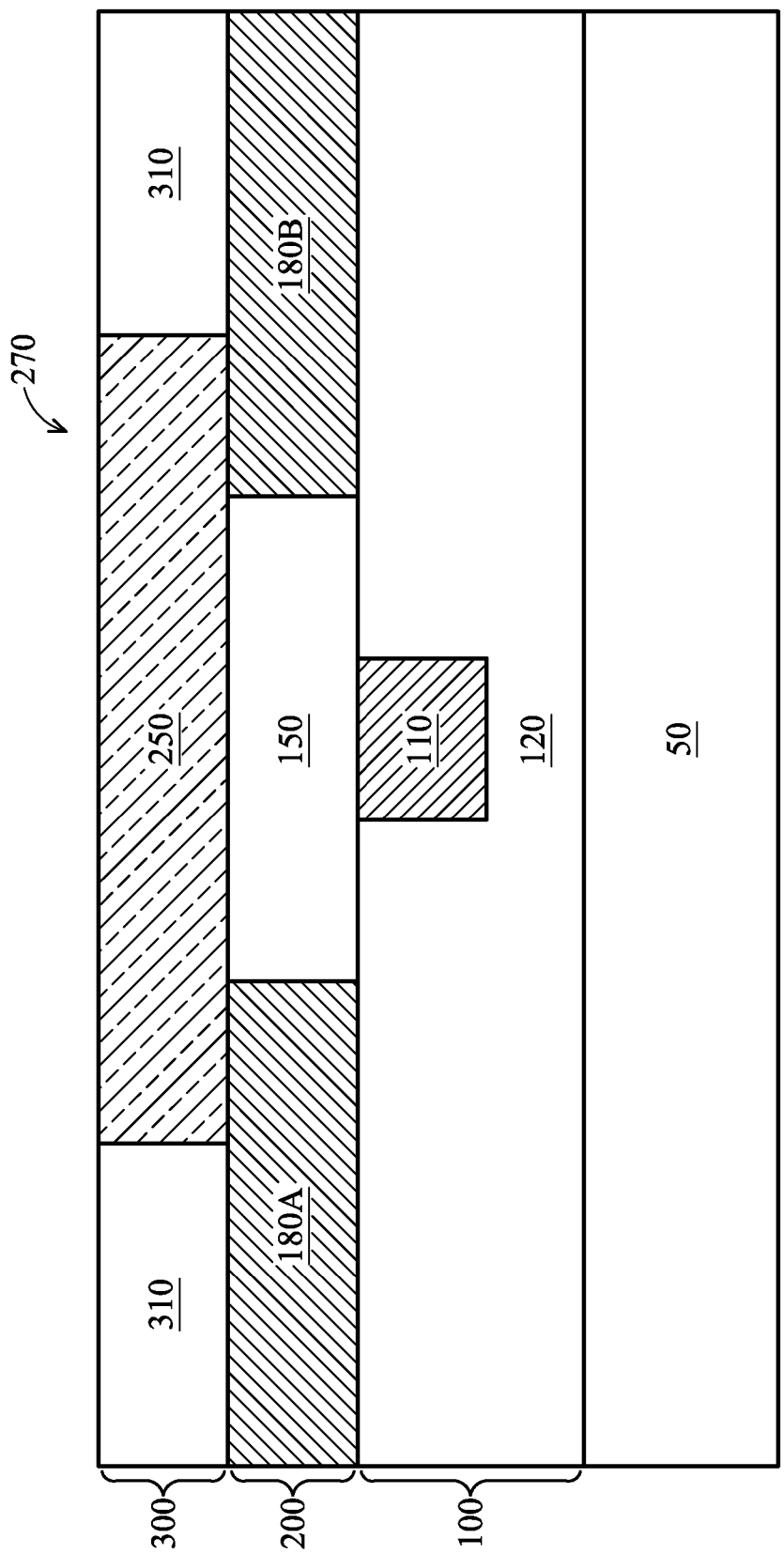

To illustrate the disposition of the metal line 250 more clearly, referring now to FIG. 8, which is a simplified diagrammatic fragmentary cross-sectional side view of an interconnect structure 270. The cross-sectional side view of the interconnect structure 270 is obtained by taking a cross-section from point A to point B in the top view of FIG. 7. The interconnect structure 270 includes a plurality of interconnect layers 100, 200, and 300. The interconnect layer 100 is a lower level interconnect layer, for example a M1 layer. The metal line 110 is located in the interconnect layer 100 and surrounded by the dielectric material 120. The interconnect layer 200 is a mid level interconnect layer, for example a M2 layer. The metal line segments 180A-180B are located in the interconnect layer 200. The dielectric material 150 isolates the metal line segments 180A-180B and therefore constitutes a "gap" between the metal line segments 180A-180B. The interconnect layer 300 is an upper level interconnect layer, for example a M3 layer. The metal line 250 is located in the interconnect layer 300. A dielectric material 310 in the interconnect layer 300 provides isolation for the metal line 250.

As discussed above, the metal line segments 180A-180B are divided into these two separate segments because a single continuous metal line would have resulted in an unwanted interface (or unwanted via) with the metal line 110. To ensure that the metal line segments 180A-180B are still electrically coupled together, the metal line 250 is formed in the interconnect layer 300 thereabove to serve as a bridge. As shown in FIG. 8, a portion of the metal line 250 is disposed above the dielectric material 150, i.e., the gap between the metal line segments 180A-180B. The end portions of the metal line 250 are disposed above and are in physical contact with the metal line segments 180A-180B, respectively. In this manner, the metal line 110 is no longer electrically coupled to the metal line segments 180A-180B—thereby eliminating the unwanted via—but the electrical continuity of the metal line segments 180A-180B is still preserved by the metal line 250. Once again, the configuration shown in FIG. 8 is only an example of bypassing the unwanted interconnection to remove the undesired via. In other embodiments, either the metal line 110 or the metal line 180 may be broken up to avoid the interconnection with the other, and the "bridging" metal segment may be implemented in any interconnect layer above or below either of the metal lines 110 or 180.

Figure 9:
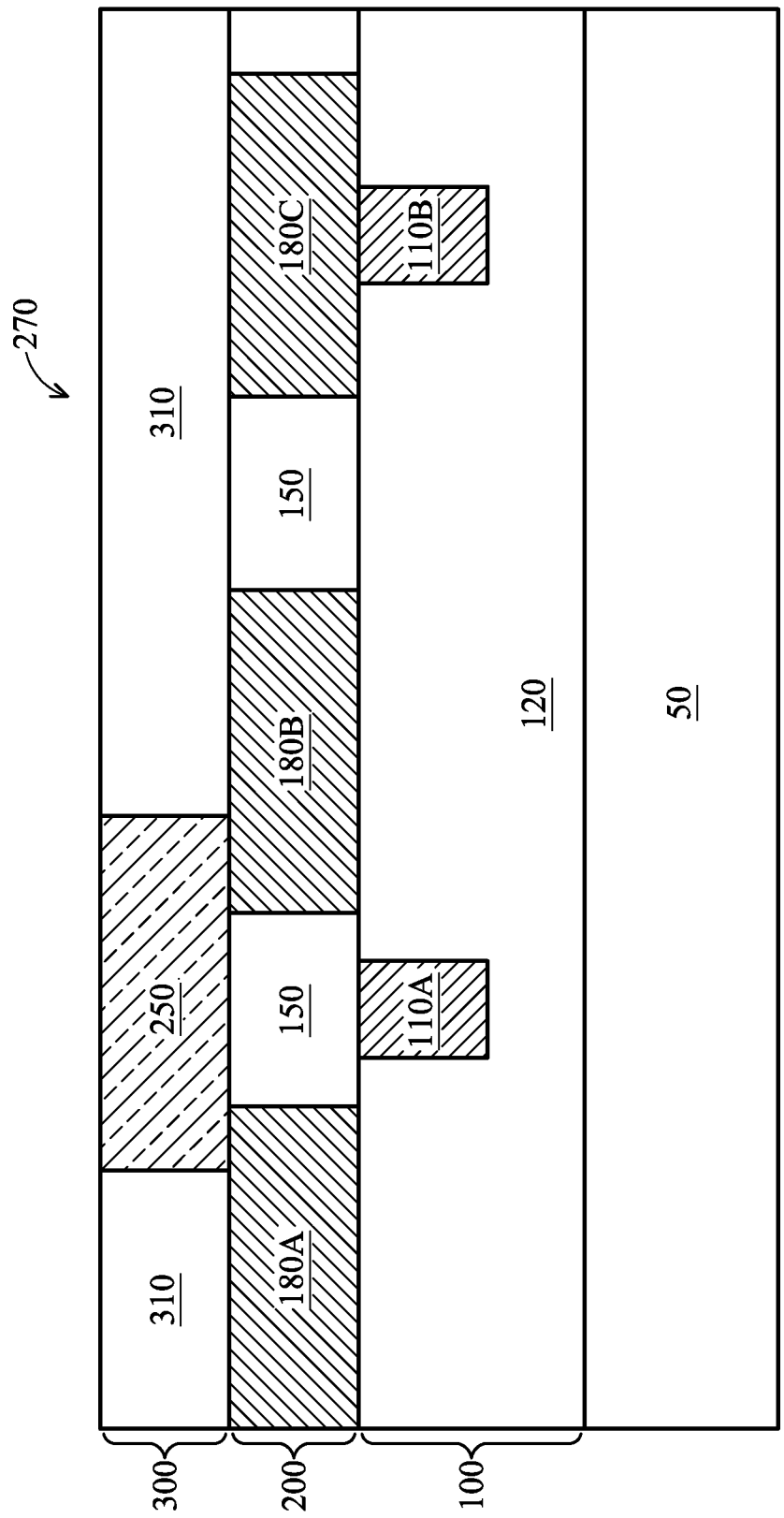

FIG. 9 is another simplified diagrammatic fragmentary cross-sectional side view of the interconnect structure 270. In addition to showing the same elements (e.g., the metal lines 180A-180B or 250) from FIG. 8, the cross-sectional view in FIG. 9 is more inclusive and also shows a metal line 110B in the interconnect layer 100 that is in direct physical contact with a metal line 180C in the interconnect layer 200. In other words, the interface/interconnection between the metal lines 110B and 180C constitute a desired "self-aligned via." It is understood that the interconnect structure in FIG. 9 is provided simply to demonstrate the present disclosure in greater detail (since it illustrates both a desired "self-aligned via" as well as how to bypass an unwanted via) and is therefore wholly consistent with the interconnect structure of FIG. 8.

Figure 10:
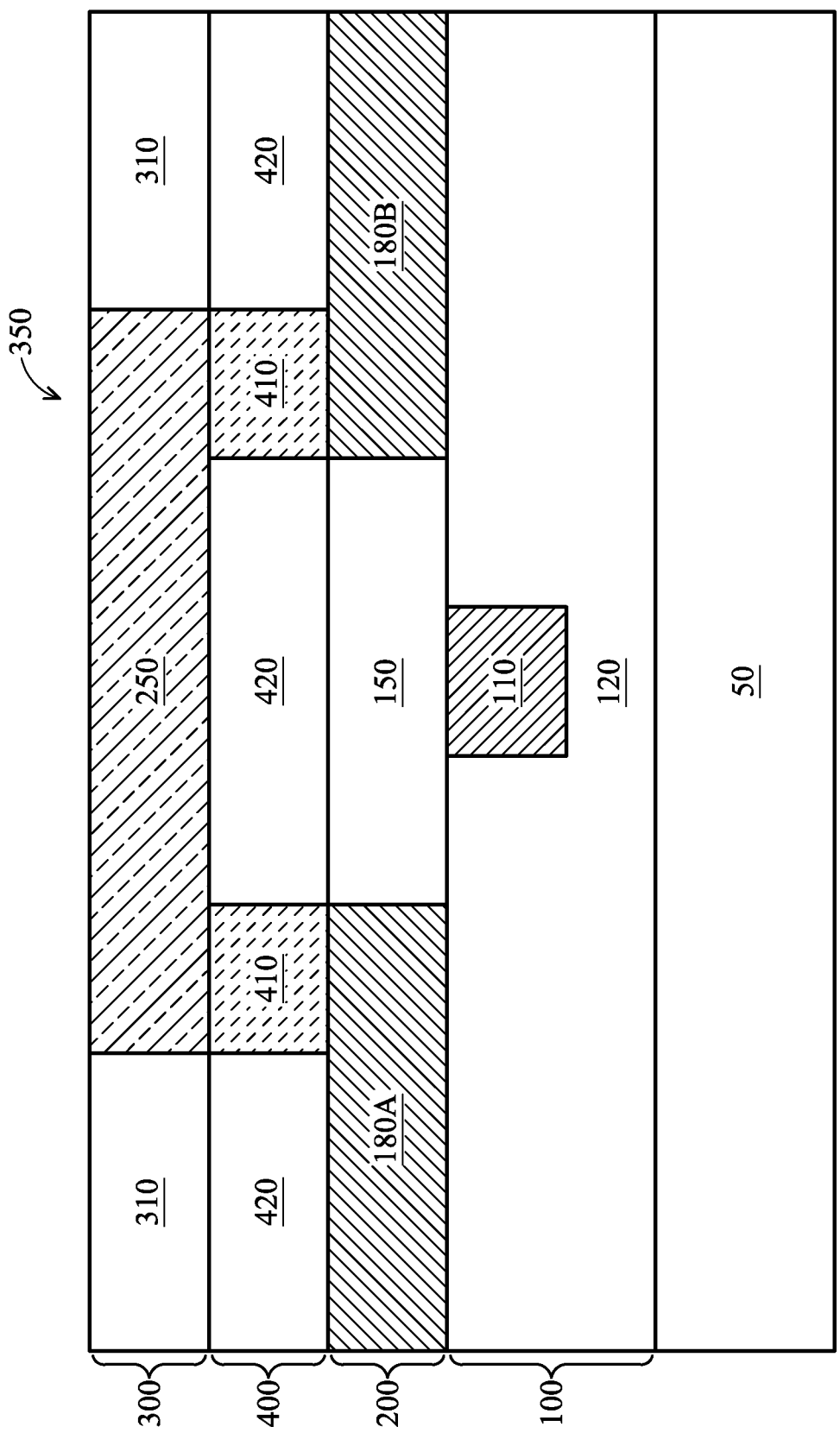

FIG. 10 illustrates a simplified diagrammatic fragmentary cross-sectional side view of an interconnect structure 350 according to an alternative embodiment that also overcomes the unwanted via problem. The interconnect structure 350 includes a plurality of interconnect layers 100, 200, 300, and 400. The interconnect layers 100, 200, and 300 of the interconnect structure 350 are substantially similar to those of the interconnect structure 270 shown in FIG. 8. Therefore, the details of these interconnect layers and their components are not repeated again for reasons of simplicity. One difference, however, is that the interconnect layer 300 is not disposed directly on top of the interconnect layer 200. Instead, another interconnect layer 400 is sandwiched between the interconnect layers 200 and 300. In other words, whereas the interconnect layer 300 was a M3 layer before (i.e., in FIG. 8), the interconnect layer 300 of the interconnect structure 350 is a M4 layer. The interconnect layer 400 now constitutes the M3 layer.

The interconnect layer 400 includes a plurality of metal lines 410 that are isolated by a dielectric material 420. The metal lines 410 come into direct physical contact with, and are sandwiched between, the metal line 250 and the metal line segments 180A-180B. The dielectric material 420 provides a gap between the metal lines 410. Through the metal lines 410, the metal line segments 180A-180B are electrically coupled together by the metal line 250. In other words, the routing scheme of FIG. 10 skips not one, but two interconnect levels before the metal line segments 180A-180B are bridged together.

Figure 11:
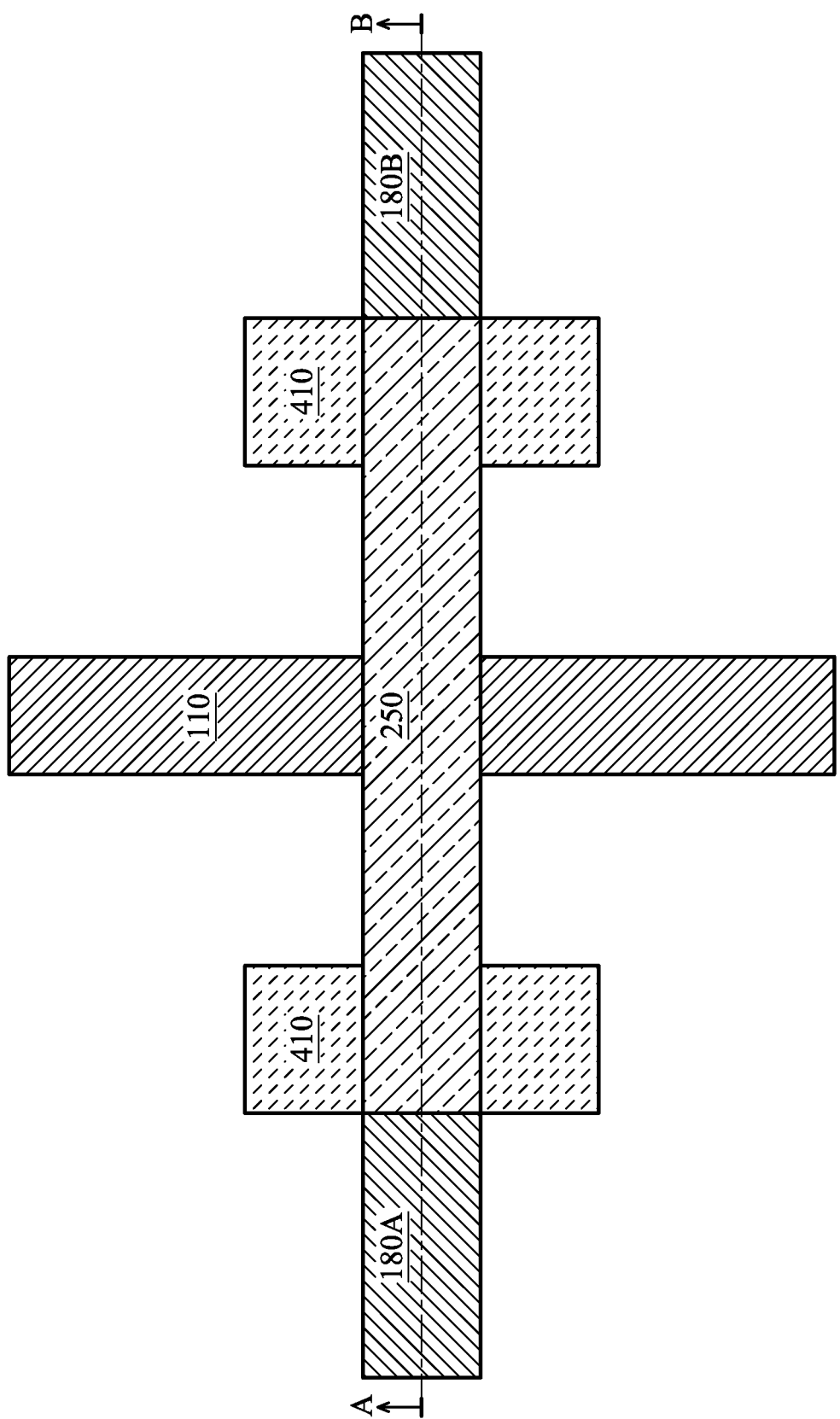

To illustrate the routing scheme provided by the interconnect structure 350 more fully, FIG. 11 shows a simplified diagrammatic fragmentary top view of the interconnect structure 350. The cross-sectional side view of the interconnect structure 350 illustrated in FIG. 10 is obtained by taking a cross-section from point A to point B in the top view of FIG. 11. As shown in FIG. 11, the metal lines 410 extend in the same direction as the metal line 110, i.e., along the Y-direction. The metal lines 410 provides electrical coupling between the metal line segments 180A-180B and the metal line 250.

Based on the discussions above, it can be seen that the embodiments of the present disclosure offer advantages, it being understood that different embodiments may offer different advantages, and not all the advantages are discussed herein, and that no particular advantage is required for all embodiments. One of the other advantages of certain embodiments of the present disclosure is that, by forming the metal lines from two different interconnect layers to be in physical contact with one another, no vias are required in the interconnect structure. The interface between the overlapped metal lines effectively constitute self-aligned vias. The elimination of actual vias reduces fabrication defects caused by alignment or overlay errors or by lack of process uniformity.

Another advantage of the embodiments of the present disclosure is the elimination of "unwanted vias", which are unwanted interconnections between metal lines from different metal layers. Rather than letting two metal lines overlap to form the undesired interface/interconnection, the present disclosure breaks up one of the metal lines into separate metal line segments. These metal line segments are then bridged together by another metal line located in a different interconnect layer. By doing this, the undesired interconnection or via can be obviated, and yet the electrical integrity is still maintained since the two divided metal line segments are still electrically joined together.

It is understood that although the interconnect structure according to the present disclosure can be formed to be totally via-free, it need not necessarily be implemented that way. For example, in some alternative embodiments, some interconnect layers may be formed to be via-free by adopting the routing scheme of the present disclosure, while other interconnect layers may still utilize actual vias to interconnect their metal lines. The specific routing scheme of the interconnect structure may be configured and implemented according to design requirements and manufacturing concerns. In addition, some electrical contacts may still be employed to provide electrical connections or electrical access to the semiconductor features formed on a wafer, for example the source, drain, and gate regions of a transistor device.

One of the broader forms of the present disclosure involves a semiconductor device. The semiconductor device includes: a substrate; a first conductive line disposed over the substrate, wherein the first conductive line is located in a first interconnect layer and extends along a first direction; a second conductive line and a third conductive line each extending along a second direction different from the first direction, wherein the second and third conductive lines are located in a second interconnect layer different from the first interconnect layer, and wherein the second and third conductive lines are separated by a gap that is located over or below the first conductive line; and a fourth conductive line electrically coupling the second and third conductive lines together, the fourth conductive line being located in a third interconnect layer different from the second interconnect layer.

In some embodiments, the fourth conductive line extends along the second direction.

In some embodiments, the first direction is perpendicular to the second direction.

In some embodiments, the fourth conductive line is disposed over the gap between the second and third conductive lines.

In some embodiments, the semiconductor device further includes: a fifth conductive line being located in the first interconnect layer; and a sixth conductive line being located in the second interconnect layer; wherein the fifth conductive line and the sixth conductive line are in direct physical contact.

In some embodiments, the semiconductor device further includes: a fifth conductive line being disposed between the second conductive line and the fourth conductive line; and a sixth conductive line being disposed between the third conductive line and the fourth conductive line; wherein the fifth and sixth conductive lines are located in a fourth interconnect layer that is disposed between the second interconnect layer and the third interconnect layer.

In some embodiments, the fifth and sixth conductive lines each extend along the first direction.

In some embodiments, at least one of the first, second, and third interconnect layers is free of vias.

In some embodiments, the gap between the second and third conductive lines is filled by a dielectric component.

Another of the broader forms of the present disclosure involves a semiconductor device. The semiconductor device includes: a first metal layer formed over a substrate, the first metal layer containing a first metal line that is oriented in a first direction; a second metal layer formed over the substrate, the second metal layer being different from the first metal layer, the second metal layer containing a second metal line, a third metal line, and a dielectric component separating the second and third metal lines, the second and third metal lines being oriented in a second direction different from the first direction; and a third metal layer formed over the substrate, the third metal layer being different from the first metal layer and the second metal layer, the third metal layer containing a fourth metal line being located over or below the dielectric component and bridging the second and third metal lines.

In some embodiments, the fourth metal line is oriented in the second direction; and the first direction is perpendicular to the second direction.

In some embodiments, the first metal layer further contains a fifth metal line; and the second metal layer further contains a sixth metal line that directly abuts the fifth metal line.

In some embodiments, the semiconductor device further includes a fourth metal layer that is formed between the second metal layer and the third metal layer, and wherein the fourth metal layer contains: a fifth metal line that is formed between the second metal line and the fourth metal line; and a sixth metal line that is formed between the third metal line and the fourth metal line.

In some embodiments, the fifth and sixth metal lines are each oriented in the first direction.

In some embodiments, at least one of the first, second, and third metal layers is free of electrical vias.

Still another of the broader forms of the present disclosure involves a method of fabricating a semiconductor device. The method includes: forming a first metal layer over a substrate, the first metal layer containing a plurality of first metal lines extending in a first direction; forming a second metal layer over the substrate, the second metal layer being different from the first metal layer, the second metal layer containing a plurality of second metal lines extending in a second direction different from the first direction, the second metal lines being separated by one or more dielectric components, wherein a first subset of the second metal lines is located directly on a first subset of the first metal lines, and wherein one of the dielectric components separating a second subset of the second metal lines is located directly on a second subset of the first metal lines; and forming a third metal layer over the substrate, the third metal layer being different from the first metal layer and the second metal layer, the third metal layer containing at least one third metal line that is located over or below the second subset of the second metal lines and over or below the dielectric component of the second metal layer, wherein the second subset of the second metal lines are electrically coupled together by the third metal line.

In some embodiments, the forming the first metal layer, the forming the second metal layer, and the forming the third metal layer are performed such that at least one of the first metal layer, the second metal layer, and the third metal layer is free of electrical vias.

In some embodiments, the third metal line extends in the second direction; and the first direction is perpendicular to the second direction.

In some embodiments, the method further includes: forming a fourth metal layer between the second metal layer and the third metal layer, wherein the fourth metal layer contains a plurality of fourth metal lines that electrically couple together the third metal line and the second subset of the second metal lines.

In some embodiments, the fourth metal lines extend in the first direction.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
providing a substrate having a region with a silicon top surface;
depositing a dielectric layer directly over and covering the silicon top surface, wherein the dielectric layer has a first thickness;
forming a first metal layer in the dielectric layer and over the silicon top surface of the substrate, the first metal layer containing a first metal line having a length defined by a lower surface and an upper surface each extending in a first direction parallel to the silicon top surface of the substrate, and wherein the lower surface is planar and the upper surface is planar, wherein the length is greater than a width of the first metal line, the width defined by a first planar sidewall and an opposing planar second sidewall each extending in a second direction different than the first direction, wherein the second direction is parallel to the silicon top surface of the substrate, wherein the forming the first metal layer includes:

forming a trench in the dielectric layer and over the silicon top surface, wherein the trench has a depth less than the first thickness; and filling the trench with a conductive material to form the first metal line, wherein a portion of the dielectric layer interposes a bottom surface of the first metal line and the silicon top surface, wherein the portion of the dielectric layer has a second height equal to the first thickness minus the depth of the trench;

forming a second metal layer over the first metal layer, the second metal layer including a first metal line of the second metal layer and a second metal line of the second metal layer, the first and second metal lines of the second metal layer each having a length defined by respective planar top surface and opposing planar bottom surfaces each extending in the second direction and a width defined by a respective planar first sidewall and an opposing planar second sidewall, the width less than the length, extending in the first direction, wherein the first and second metal lines of the second metal layer are separated by dielectric, wherein the first metal line of the second metal layer interfaces directly with the first metal line of the first metal layer, and wherein the second metal line of the second metal layer has a first portion and a second portion separated by a dielectric component, the dielectric component located directly on the first metal line of the first metal layer and wherein the first and second portion do not directly interface the first metal line of the first metal layer; and forming a third metal layer over the first metal layer and the second metal layer and over the silicon top surface, the third metal layer containing at least one third metal line and having a length extending in the second direction, having a width, less than the length extending in the first direction, and having an interface with each of the first portion and the second portion of the second metal line of the second metal layer and directly interfacing the dielectric component of the second metal layer, wherein the first and second portions of the second metal line of the second metal layer are electrically coupled together by the third metal line.

2. The method of claim 1, wherein the first metal layer, the second metal layer, and the third metal layer are free of electrical vias.

3. The method of claim 1, wherein:
the first direction is perpendicular to the second direction.

4. The method of claim 1, wherein the filling the trench with the conductive material includes depositing copper.

5. A method comprising:
providing a semiconductor substrate having a semiconductor top surface;
depositing a dielectric layer physically interfacing with a first region of the semiconductor top surface;
forming a trench in the dielectric layer to expose a surface of a portion of the dielectric layer;
filling the trench with a conductive material to form a first conductive line directly on the surface of the portion of the dielectric layer, wherein the portion of the dielectric layer interposes a bottom surface of the first conductive line and the first region of the semiconductor top surface of the semiconductor substrate, wherein the first conductive line is located in a first interconnect layer and has a length dimension greater than its width dimension, wherein the length dimension extends along a first direction parallel to a top surface of the first interconnect layer;
disposing a second conductive line and a third conductive line each extending along a second direction different from the first direction, wherein the second and third conductive lines are located in a second interconnect layer above the first interconnect layer and include planar top surfaces and planar bottom surfaces of conductive material, wherein the second direction is parallel to a top surface of the second interconnect layer, and wherein the second and third conductive lines are separated by a gap filled with dielectric that directly interfaces with the first conductive line;
disposing a fourth conductive line electrically coupling the second and third conductive lines together, the fourth conductive line being located in a third interconnect layer that is above the first interconnect layer and above the second interconnect layer, wherein a via-free contiguous conductive path is formed at least partially by the second, third, and fourth conductive lines; and
disposing a sixth conductive line having a length extending in the second direction, wherein the length is greater than a width dimension of the sixth conductive line and being located in the second interconnect layer, wherein the sixth conductive line is in direct physical contact with the first conductive line, wherein a second contiguous conductive path is formed at least partially by the first and sixth conductive lines.

6. The method of claim 5, wherein the fourth conductive line extends along the second direction.

7. The method of claim 5, wherein the fourth conductive line is disposed over the gap between the second and third conductive lines.

8. The method of claim 5, wherein the first, second, and third interconnect layers are free of vias.

9. A method for forming a semiconductor device, the method comprising:
providing a substrate having a semiconductor composition;
depositing a dielectric layer directly over the semiconductor composition and having a first thickness;
forming a trench in the dielectric layer and over the semiconductor composition;
filling the trench with a conductive material to form a first conductive line directly on the dielectric layer, wherein the first conductive line is vertically over the semiconductor composition, wherein the first conductive line is located in a first interconnect layer and extends along a first direction parallel to a top surface of the substrate having semiconductor composition;
disposing a second conductive line and a third conductive line each extending along a second direction different from the first direction, wherein the second and third conductive lines are located in a second interconnect layer above the first interconnect layer, wherein the second direction is parallel to the top surface of the substrate having semiconductor composition, and wherein the second and third conductive lines are separated by a first gap of dielectric material that is located over and directly on the first conductive line;
disposing a fourth conductive line electrically coupling the second and third conductive lines together, the fourth conductive line being located in a third interconnect layer that is located over the first interconnect layer and the second interconnect layer, and wherein the fourth conductive line has a length greater than a width, the length extending in the second direction; and disposing a fifth conductive line and a sixth conductive line in a fourth interconnect layer between the second interconnect layer and the third interconnect layer, the fifth conductive line physically contacting both the second conductive line and the fourth conductive line, the sixth conductive line physically contacting both the third conductive line and the fourth conductive line, wherein the fifth conductive line has a length in the first direction and a width in the second direction, the length of the fifth conductive line being greater than the width of the fifth conductive line, wherein the sixth conductive line has a length in the first direction and a width in the second direction, the length of the sixth conductive line being greater than the width of the sixth conductive line, wherein the fifth conductive line and the sixth conductive line are separated by a second gap that is located over the first gap; and wherein a dielectric component including the first gap of the second interconnect layer and the second gap of the fourth interconnect layer extends continuously from a top surface of the first conductive line to a bottom surface of the fourth conductive line.

10. The method of claim 9, wherein the first direction is perpendicular to the second direction.

11. The method of claim 9, wherein the first, second, third, and fourth interconnect layers are free of vias.

12. The method of claim 9, wherein a first sidewall of the first gap vertically aligns with a second sidewall of the second gap, wherein a third sidewall of the first gap vertically aligns with a fourth sidewall of the second gap.

13. The method of claim 9, wherein a width of the second conductive line is substantially the same as the width of the fourth conductive line.

14. The method of claim 9, wherein the providing the substrate includes providing the semiconductor composition of silicon.

15. The method of claim 9, wherein the trench extends from a first top surface of the dielectric layer to a second top surface of the dielectric layer, the trench having a depth, wherein the depth is less than the first thickness.

* * * * *